(12) United States Patent
Abouelenin

(10) Patent No.: US 9,735,857 B2
(45) Date of Patent: Aug. 15, 2017

(54) PREDISTORTION IN SATELLITE SIGNAL TRANSMISSION SYSTEMS

(71) Applicant: University of Surrey, Guildford Surrey (GB)

(72) Inventor: Ahmed Abouelenin, Guildford (GB)

(73) Assignee: Airbus DS Limited, Hertfordshire (GB)

( * ) Notice: Subject to any disclaimer, the term of this patent is extended or adjusted under 35 U.S.C. 154(b) by 0 days.

(21) Appl. No.: 14/910,799

(22) PCT Filed: Aug. 6, 2014

(86) PCT No.: PCT/GB2014/052414
§ 371 (c)(1),
(2) Date: Feb. 8, 2016

(87) PCT Pub. No.: WO2015/019091
PCT Pub. Date: Feb. 12, 2015

(65) Prior Publication Data
US 2016/0191146 A1 Jun. 30, 2016

(30) Foreign Application Priority Data
Aug. 9, 2013 (GB) .................................. 1314336.7

(51) Int. Cl.
*H04B 1/04* (2006.01)
*H04B 1/62* (2006.01)
(Continued)

(52) U.S. Cl.
CPC ....... *H04B 7/18513* (2013.01); *H03F 1/0222* (2013.01); *H03F 1/3247* (2013.01);
(Continued)

(58) Field of Classification Search
CPC H04B 1/0475; H04B 2001/0425; H04B 1/62; H04B 1/04
(Continued)

(56) References Cited

U.S. PATENT DOCUMENTS 6,141,541 A 10/2000 Midya et al.
6,349,216 B1 2/2002 Alberth, Jr. et al.
(Continued)

FOREIGN PATENT DOCUMENTS

EP 1672783 A1 6/2006
GB 2480687 A 11/2011

OTHER PUBLICATIONS

Search Report, Intellectual Property Office, Application No. GB1314336.7, Jun. 25, 2014.
(Continued)

*Primary Examiner* — Philip Sobutka
(74) *Attorney, Agent, or Firm* — Murtha Cullina LLP; Anthony P. Gangemi

(57) ABSTRACT

A signal transmission system for a satellite comprises means (31) for producing a signal to be transmitted; a first signal channel (37) which includes a first digital pre-distortion device (32) for applying pre-distortion to the signal; a second signal channel (38) for processing an envelope of the signal, which includes a second digital pre-distortion device (35) for applying pre-distortion to the envelope of the signal; and output means (34) for transmitting the signal.

11 Claims, 7 Drawing Sheets

(51) Int. Cl.
*H04B 7/185* (2006.01)
*H03F 1/02* (2006.01)
*H03F 1/32* (2006.01)

(52) U.S. Cl.
CPC ............ *H04B 1/04* (2013.01); *H04B 1/62* (2013.01); *H03F 2200/451* (2013.01); *H03F 2201/3215* (2013.01); *H03F 2201/3227* (2013.01); *H04B 1/0475* (2013.01); *H04B 2001/0425* (2013.01); *Y02B 60/50* (2013.01)

(58) Field of Classification Search
USPC ...... 375/296; 455/114.3, 127.2, 114.2, 115.1
See application file for complete search history.

(56) References Cited

U.S. PATENT DOCUMENTS

| | | | |
|---|---|---|---|
| 6,624,711 B1 | 9/2003 | Khan et al. | |
| 7,151,411 B2 | 12/2006 | Martin et al. | |
| 7,339,426 B2 | 3/2008 | Gurvich et al. | |
| 7,860,466 B2 | 12/2010 | Woo et al. | |
| 2004/0061555 A1 | 4/2004 | Lynch | |
| 2006/0209984 A1* | 9/2006 | Kenington | H03F 1/0222 375/297 |
| 2009/0088093 A1 | 4/2009 | Nentwig | |
| 2013/0222057 A1* | 8/2013 | Henshaw | H03F 1/0222 330/127 |

OTHER PUBLICATIONS

International Search Report and The Written Opinion of the International Searching Authority, International Application No. PCT/GB2014/052414, Nov. 20, 2014.

* cited by examiner

PREDISTORTION IN SATELLITE SIGNAL TRANSMISSION SYSTEMS

The present invention relates to satellite transmission systems and in particular to the use of pre-distortion of signals that are to be transmitted by such systems.

In satellite communications, there is an increasing demand to support higher data throughput on necessarily pre-allocated bandwidth channels. In communication payloads, DC-to-RF power conversion efficiency is an important consideration and most of the DC power is consumed by the RF Power Amplifier (PA). The maximization of PA efficiency while maintaining low distortion is a key objective. Both power and bandwidth efficiency can be increased by employing digital pre-distortion (DPD).

In future satellite communications links, a huge amount of data has to be transmitted due to the increase in the accuracy of the payload, number of subscribers or the need for transmission of a large volume of data within a limited period of time (maximum visibility). This could be achieved by employing a spectrally efficient modulation technique (SEMT), e.g. M-ary QAM (Quadrature amplitude modulation), which necessarily has a non-constant envelope with increased information carrying ability per unit bandwidth. However, this leads to very high constraints on the linearity of the transmitter power amplifier (PA).

Linear PAs, although suitable for SEMTs, are the main source of power consumption in the transmitter. Their use results in low overall transmitter efficiency due to the wasted power as a heat which necessarily requires thermal management. In contrast, a high efficiency PA is rather a complex nonlinear system (e.g. switch), and is not suitable for transmission of SEMTs.

On the one hand, due to variations in the amplitude of generated SEMT and saturated (i.e. power efficient) PA nonlinearities the transmitted SEMT occupies larger bandwidth (i.e. spectral regrowth) and results in out-of-band distortion that disturbs the adjacent channels. This may cause noncompliance to relevant regulatory standards (e.g. International Telecommunications Union ITU) and may violate a predefined spectral mask constraint. On the other hand, SEMTs have a weak tolerance to amplitude disturbances that occur in the nonlinear amplification process since its information carrying ability depends on the signal amplitude. This may cause in-band distortion in the transmitted signal (i.e. error vector magnitude EVM) which consequently deteriorates the receiver performance in terms of bit error rate (BER). In addition, the overall transmitter power efficiency significantly deteriorates if a high peak-to-average power ratio (PAPR) signal is used where more power back-off is required. Therefore, high efficiency PAs should be used which, unfortunately, suffer from strong nonlinearities.

High efficiency PAs show a dynamic nonlinear behaviour, including memory effects if a wideband fast varying envelope signal is used. In this case, the amplified signal depends on the current and past input symbols.

To satisfy PA linearity requirements as well as to improve overall system efficiency, it is necessary to undertake some linearization. Traditionally, PA static nonlinearity has been mitigated by compromising the PA DC-to-RF power conversion efficiency where output power back-off is required. However, power backing-off is not suitable for battery operated (on-board payload) or high running costs (ground segment) systems. Moreover, power back-off cannot cope with distortion due to memory effects, hence the need for a linearization approach that achieves low in-band and out-of-band distortion and high power efficiency simultaneously. Several linearization techniques, which are analog in essence, have been proposed to cope with the PA nonlinear behaviour (e.g. Feedforward, RF predistortion and LINC). However, digital predistortion DPD has shown a good simultaneous efficiency and linearity improvements for a transmitter. In addition, DPD is implemented in an FPGA (field programmable gate array) or ASIC (application specific integrated circuit), and is thus immune to the components' tolerance or aging.

The present invention provides a signal transmission system for a satellite which may comprise means for producing a signal to be transmitted. A first signal channel can be provided which includes a digital pre-distortion device for applying pre-distortion to the signal. Further, a second signal channel can be provided for processing an envelope of the signal. The second signal channel can include a second digital pre-distortion device for applying pre-distortion to the envelope of the signal. The system can include output means for transmitting the signal, such as an antenna.

Advantageously, a DPD system architecture is thus proposed where envelope tracking (ET) of the driver amplifier (DA) and load modulation of the PA are used to maximize the overall PAE (power added efficiency) while high PAPR (peak to average power ratio) signals can be used.

The invention also provides a method of transmitting a signal comprising producing a signal to be transmitted and applying a first pre-distortion to the signal. The pre-distorted signal can then be amplified using a first amplifier. A band-limited envelope of the signal may be isolated through a second channel in which a second pre-distortion can be applied to the envelope. The distorted envelope signal can be used to control the first amplifier. An output signal can then be transmitted from the first amplifier using an antenna.

There follows a detailed description of embodiments of the invention by way of example only and with reference to the accompanying drawings in which FIG. 1 is a schematic representation of the effects of digital pre-distortion;

Figure 1:
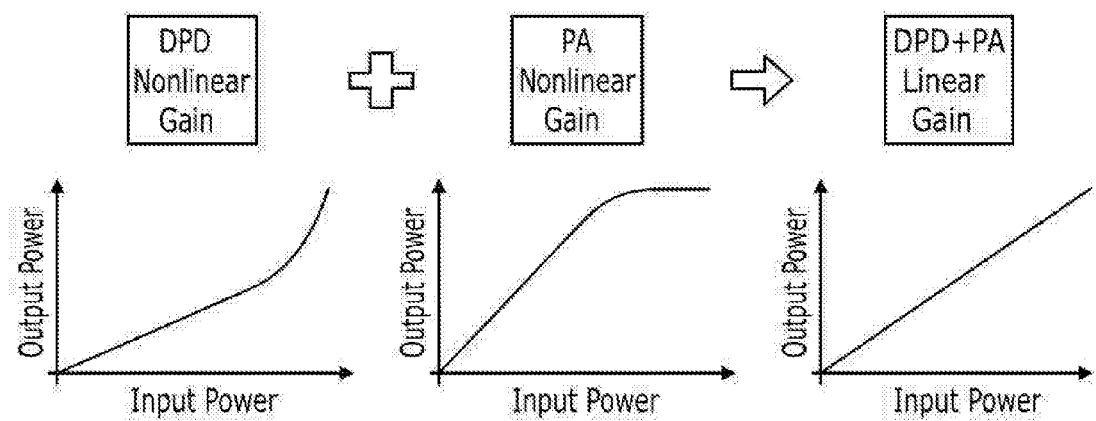

By way of further background explanation of the principles behind the invention, FIG. 1 includes three schematic graphs showing how the DPD can offset the non-linearity of the PA. The DPD has a linearization effect on the PA output. In small fractional bandwidth systems, it is not feasible to filter out out-of-band spectral regrowth due to the required high-Q filter. PA DPD-based linearization is achieved by digitally processing in-phase (I) and quadrature (Q) baseband data so that frequency components are generated within a bandwidth equal to that of the spectral regrowth (normally 5 times the modulated signal bandwidth) to compensate for the distortion due to PA nonlinearities. Thus, a wideband transmitter should be used. This digital "pre-processing" allows the PA to be operated up to saturation point and mitigates the in-band and out-of-band distortions due to nonlinear behaviour. Hence, output power back-off can be significantly reduced.

Figure 2:
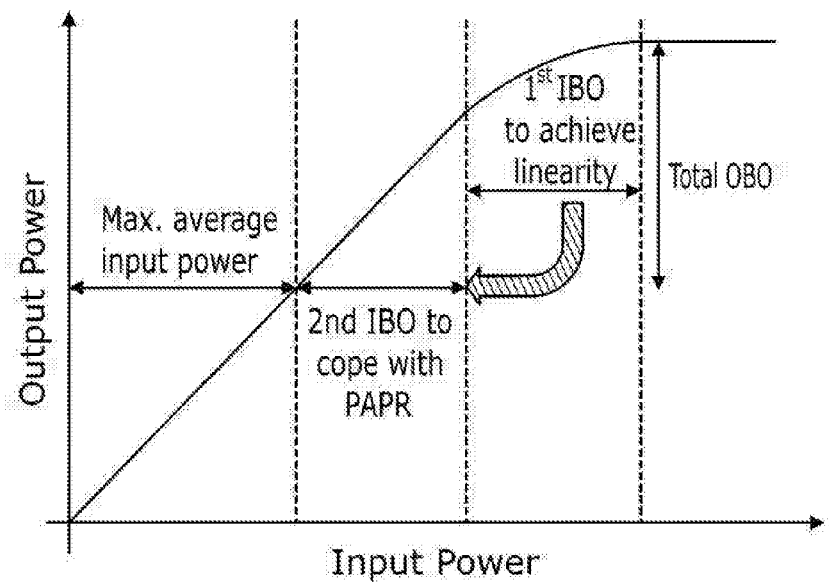
FIG. 2 is a schematic representation showing the behaviour of a typical PA.

As shown in FIG. 2, power back-off techniques can also be used to help achieve linearity in the output of the PA and to cope with signals having a high peak to average power ratio. To maintain linear amplification for high PAPR signals using linear PAs, two power back-offs can be utilised; the first to avoid the nonlinear part of the gain curve and the second which is to deal with the PAPR. Even if DPD is used to alleviate the 1st back-off, either supply or load modulation could only mitigate the 2nd back-off to achieve acceptable overall power added efficiency (PAE).

Figure 5:
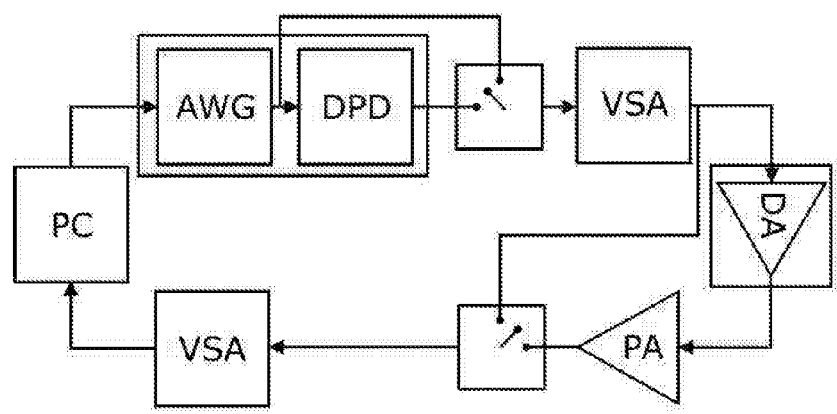
FIG. 5 is a schematic representation of a system for testing a DPD device.

FIG. 5 shows a block diagram for a typical DPD+PA hardware test setup. This setup is for implementing a method of modelling the response of a transmission system that utilises DPD using a model coefficient extraction procedure. I and Q data of a test signal can be generated on a PC using Matlab then downloaded on an arbitrary waveform generator (AWG). These data modulate an RF carrier in a Vector Signal Generator (VSG) where signal upconversion is achieved. The modulated RF carrier feeds the PA and a driver amplifier (DA) may be used for high power PAs (HPA). A Vector Signal Analyzer (VSA) downconverts then demodulates the RF modulated carrier. This allows extraction of the DPD model coefficients (in the PC) by comparing the demodulated I and Q data of the original (PA is removed) and distorted signal (i.e. signal as amplified by the PA). The DPD+PA performance can be verified by downloading the predistorter I and Q data on the AWG and measuring the PA output.

Future high throughput satellites, where a large fractional bandwidth is expected, could benefit from adopting band-limited-DPD. These benefits, compared to using a conventional DPD, could be: less hardware complexity and less processing power as a result of processing a bandwidth comparable to the original modulated signal bandwidth compared to 5 times bandwidth in conventional DPD.

Figure 3:
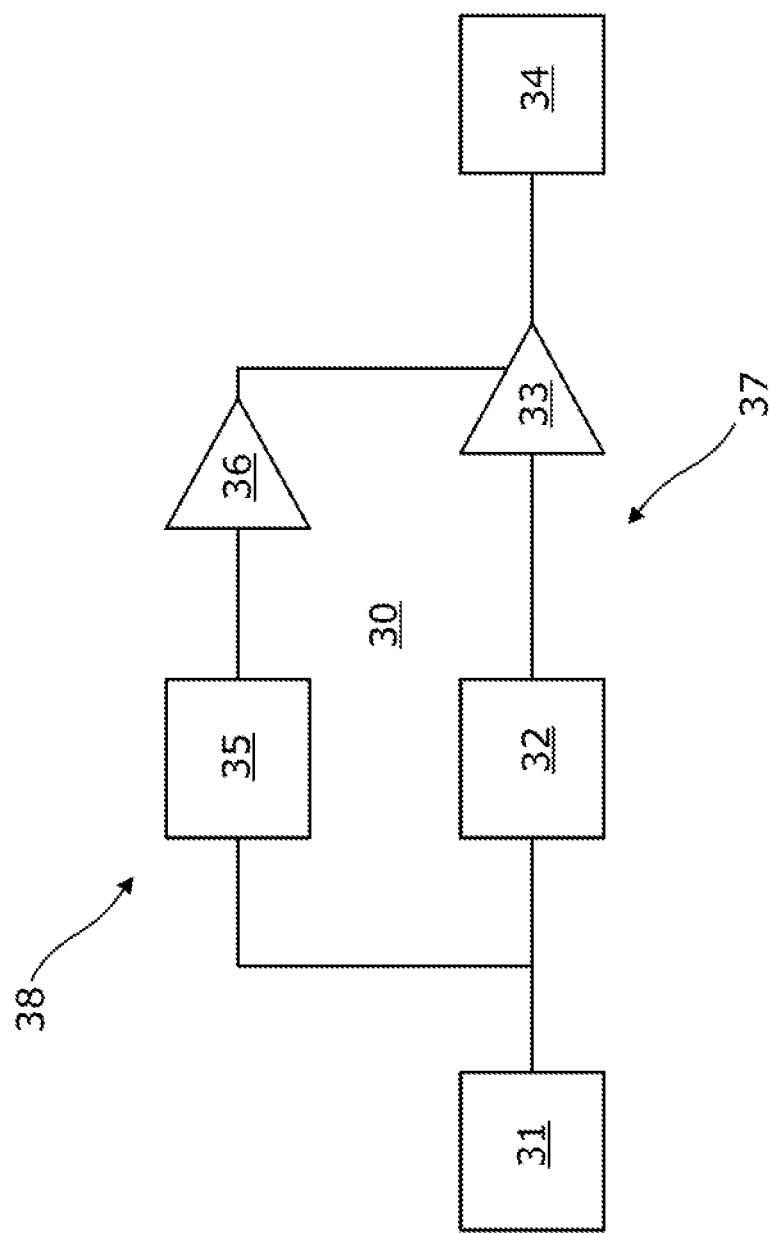
FIG. 3 is a schematic representation of a system in accordance with a first embodiment of the invention.

FIG. 3 shows a first embodiment of the signal transmission system 30. The system 30 comprises means 31 for producing a signal that is desired to be transmitted by a satellite, eg a film or television program, and a means 34 for transmitting an amplified output signal, such as an antenna 34. A first channel 37 or electrical path of the system leads from the signal production means 31 to the antenna 34, via a first digital pre-distortion device 32 and an amplifier 33 to the antenna 34. The first digital pre-distortion device 32 produces a non-linearity in the signal that cancels out the non-linearity produced by the amplifier 33. A second channel 38 or electrical path is able to isolate an envelope of the signal. The second channel includes a second digital pre-distortion device 35 which is connected to an envelope amplifier for amplifying the envelope signal. The second digital pre-distortion device 35 applies a non-linearity to the envelope signal that is cancelled out by the non-linearity of the envelope amplifier.

Figure 4:
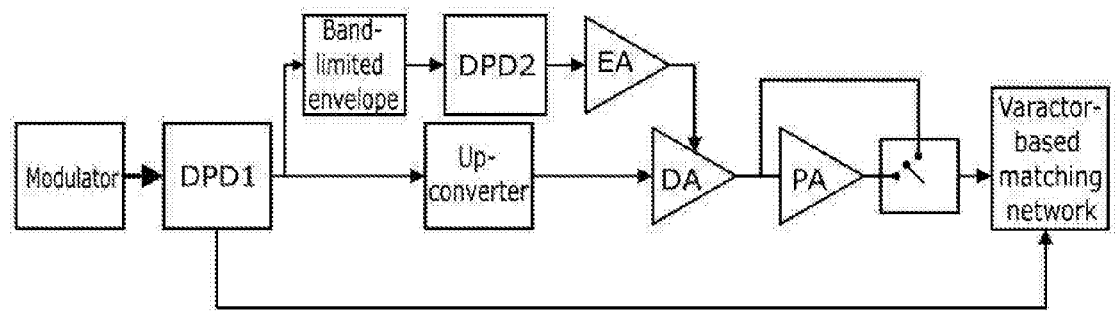
FIG. 4 is a schematic representation of a system in accordance with a second embodiment of the invention.

FIG. 4 shows a more detailed version of the embodiment of the invention shown in FIG. 3. The varactor-based matching network is modulating the output matching network based on the input modulated signal. The DPD+PA architecture shown in FIG. 3 advantageously increases the overall average power added efficiency of the system while minimizing the distortion in the driver amplifier (DA) stage. Load modulation is applied at the PA output using a varactors-based matching network where varactors can be placed in parallel to cope with high PA output power. The matching network can also be connected to an antenna for transmitting the output amplified signal. The bandwidth through path DPD1, upconverter, DA, and PA is limited to the original modulated signal bandwidth. Envelope tracking is applied to the driver amplifier using an envelope amplifier (EA) with additional DPD block (DPD2) to compensate for nonlinearities at EA output. Switching between the DA and PA is possible for low input power which further improves the average power added efficiency.

Figure 6:
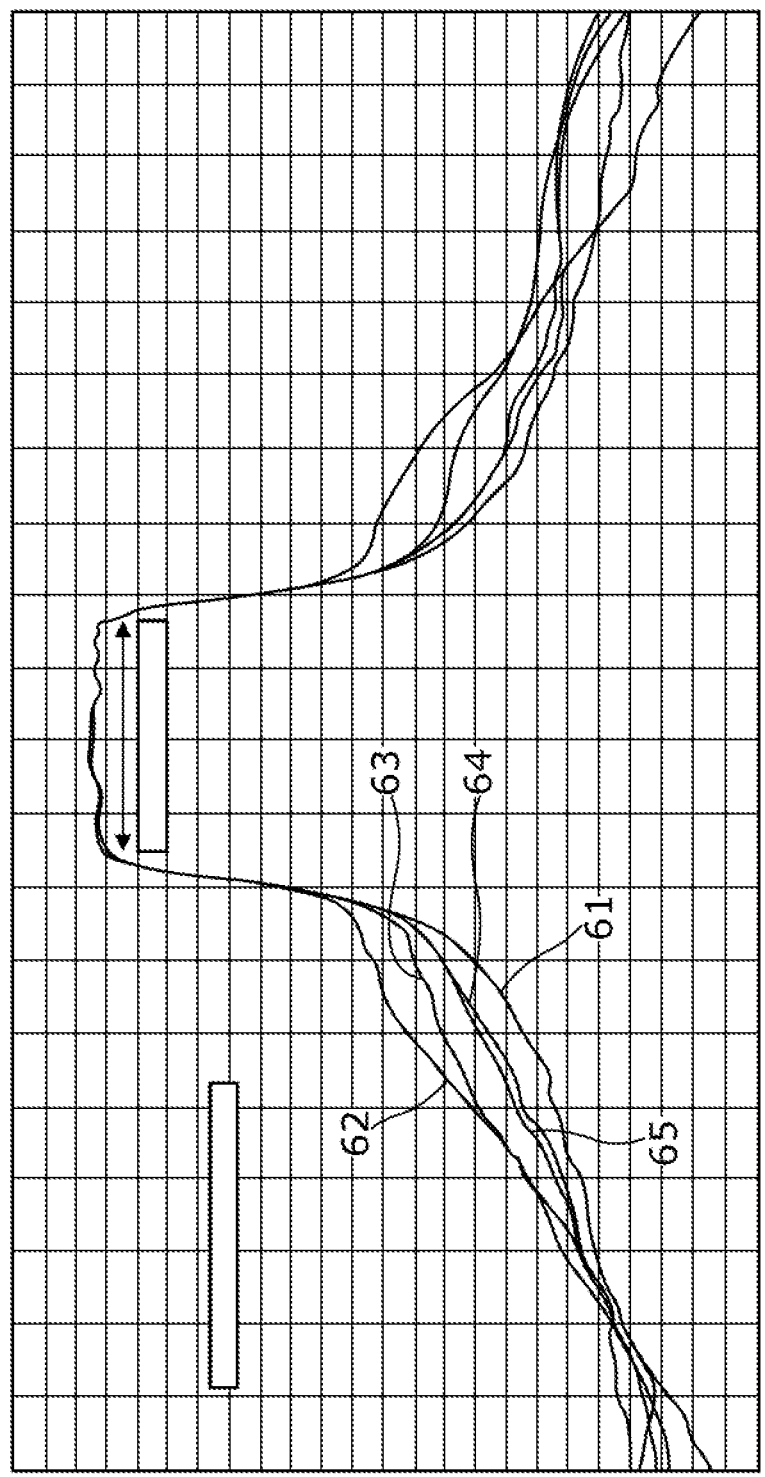
FIGS. 6 to 9 show spectra produced by systems according to the invention.

FIG. 6 shows a spectrum produced by a DPD modelling process, in particular, a NARMA-based (non-linear autoregressive moving average) DPD model for 1 GHz 1024-QAM ultra wideband signal modulated on a 4 GHz carrier using MGA-545P8 PA model on Agilent ADS© software. Three iterations are done to attain further adjacent channel power ratio (ACPR) improvement. FIG. 6 shows the original signal spectrum (61), PA distorted output (62), and DPD+PA output for the three iteration (63, 64 and 65). The vertical and horizontal axes are set to 0 to −110 dBm and 1 to 7 GHz, respectively. Approximately 12 dB improvement in ACPR is achieved while −23 dB NMSE is maintained.

Figure 7:
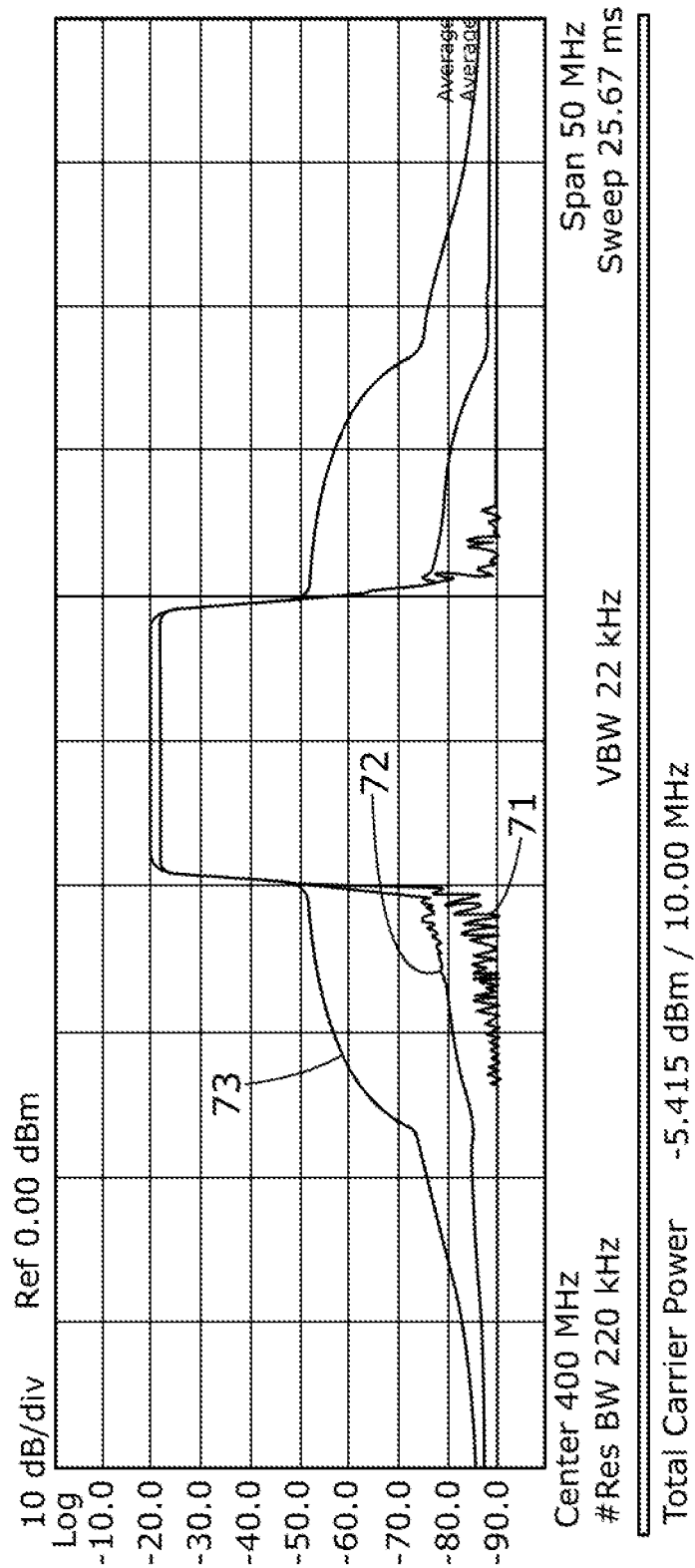
Figure 8:
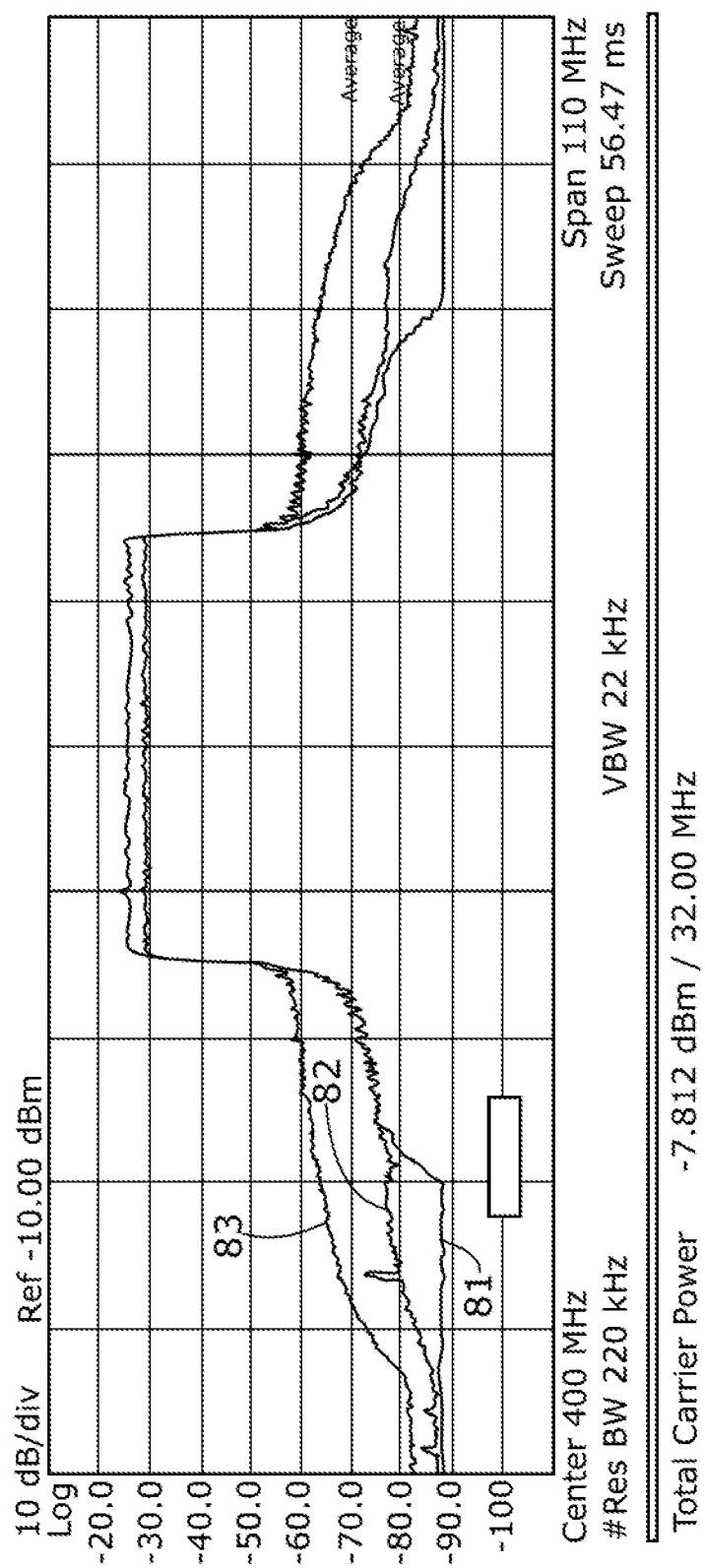
Figure 9:
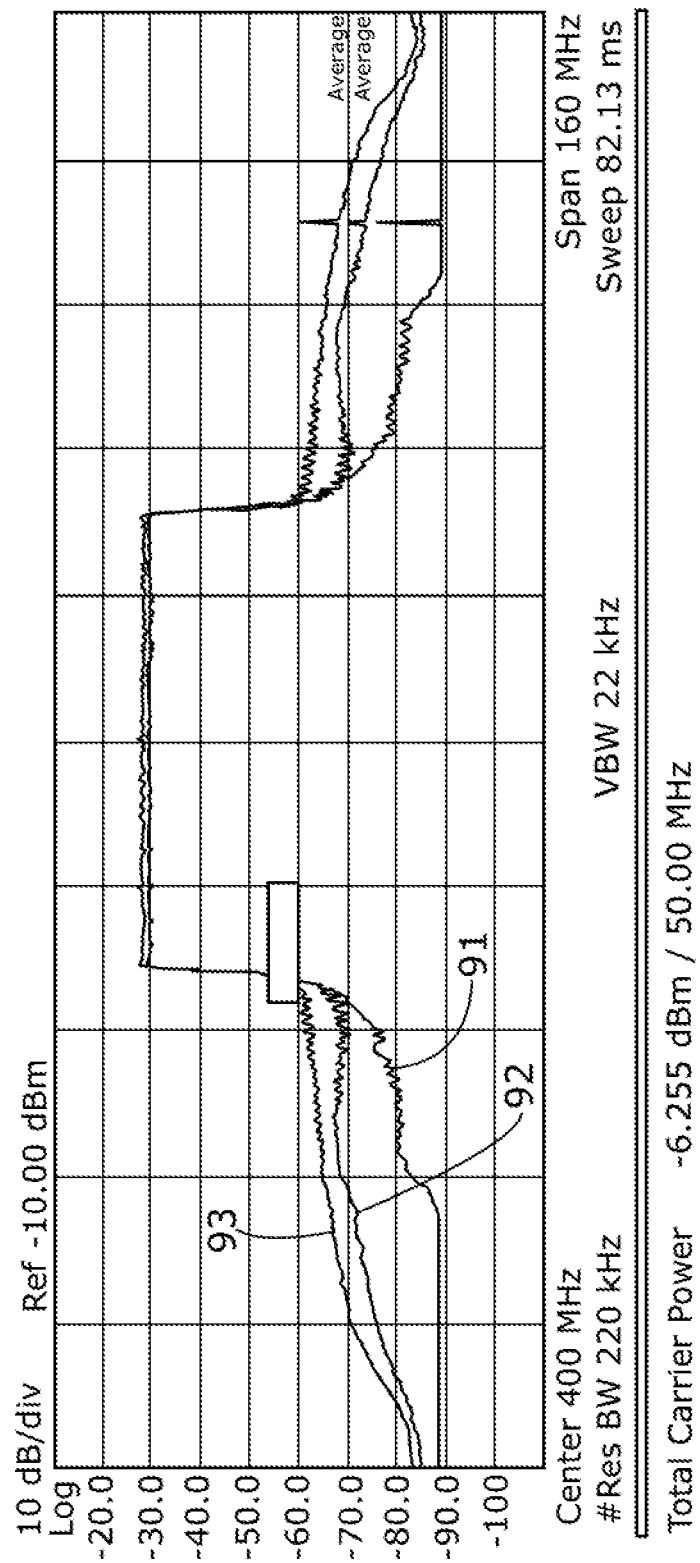

FIGS. 7 to 9 show spectra produced in a test setup as follows: A demonstration low noise amplifier (ZFL-500LN+ Mini-Circuits©) was used to demonstrate the effect of band limited DPD on the DPD+PA performance. The following equipment was used: Agilent© N5182B MXG RF Vector Signal Generator (VSG), ☐Agilent© N9030A PXA Vector Signal Analyser (VSA), and a TTi EL302Tv triple power supply. The VSG and VSA are connected through a network switch for control and data exchange via a PC. Synchronization is established by connecting a 10 MHz reference, trigger, and event ports. FIG. 7 to FIG. 9 show the measured spectra of original signal, distorted PA output, and NARMA based DPD+PA for three different modulated test signals:

FIG. 7: ☐10 MHz LTE DL (QPSK)
FIG. 8: ☐32 MHz 1024-QAM
FIG. 9: 50 MHz 1024-QAM

The spectra shown in FIGS. 7 to 9 are each normalised to the level of the original signal to facilitate comparison of the signals. In FIG. 7, line 71 represents the original signal, line 73 represents the amplified signal without DPD, and line 72 represents the signal as amplified and pre-distorted. In FIG. 8, line 81 represents the original signal, line 83 represents the amplified signal without DPD, and line 82 represents the signal as amplified and pre-distorted. In FIG. 9, line 91 represents the original signal, line 93 represents the amplified signal without DPD, and line 92 represents the signal as amplified and pre-distorted.

The adjacent channel power ratio (ACPR) and normalised mean square error (NMSE) for DPD+PA were measured for each modulated signal and are summarized in Table 1. It is to be noted that a good NMSE could be achieved in all cases while a good ACPR is achieved only for the 10 MHz BW signal. This is justified as follows; due to the limited analysis bandwidth at the PA output, i.e. 60 MHz, insufficient information about the spectral regrowth arrives to the DPD. Thus, the ACPR gets worse as the signal bandwidth becomes larger. However, DPD still copes with the in-band distortion.

TABLE 1

Measured ACPR and NMSE for DPD + PA

|  | ACPR (dB) | NMSE (dB) |
| --- | --- | --- |
| 10 MHz LTE DL | −25 | −36 |
| 32 MHz 1024 QAM | −10 | −33.54 |
| 50 MHz 1024 QAM | −4 | −33.52 |

The data thus indicate a most optimal performance for the 10 MHz LTE DL signal.

Spectral re-growth can be filtered out for large fractional bandwidth signals (e.g. in L-Band) and for this reason, the ACPR constraint is significantly relaxed. To allow reliable reception of the transmitted signal over a satellite communication link a link budget-determined ratio of the signal energy over the spectral noise density, i.e. Es/No, has to be maintained at the receiver side assuming perfect signal transmission. EVM at the transmitter side decreases this ratio and has to be kept at minimum by employing DPD.

As a result of the heritage in space technology, nonlinear (switch) PAs, although power efficient, are not commonly used whereas linear PAs (power inefficient) are used. Thus high spectral density modulation techniques are avoided. DPD plus load and supply modulation can be used on space (and ground) segments and thereby provides efficient usage of power. Moreover, a greater amount of data can be pushed into the link assuming the same power budget for a transmitter.

The figure of merit for the proposed DPD+PA should be achieving a lower EVM and high throughput with fixing the power consumption.

It is possible to use a training sequence to update the DPD model: in X-band payloads, the transmitter is on for a short period of time to transfer data when the satellite is in the visibility zone of the station. However, this does not necessarily happen for each orbit. Consequently, one of the orbits can be freed to transmit a training sequence to the data reception station. This received data could be compared, offline, to the ideal training sequence and an update for the DPD model coefficient could be extracted. This updated coefficient could be transmitted to the satellite through the TT&C transponder and used to configure the DPD model onboard. In other words, an offline adaptation could be made to cope with any unexpected very slow time variation of the PA.

DPD techniques for terrestrial communications as proposed in the present invention advantageously maximize the overall PAE while high PAPR signals can be used. A further advantage of embodiments of the present invention is that it allows less expensive (in terms of volume, mass, and cost) space and ground segment transmitters.

In mobile communications, PA electrical characteristics are mainly dependent on fast time-varying ambient and circuit parameters including supply voltage, temperature, and load mismatch. Consequently, real-time adaptation for the user handset is of great importance to maintain compliance to the spectral emissions and reliable reception of the information. This is done at the expense of additional power and hardware overhead to downconvert and demodulate, with accurate time alignment, a wideband RF signal with spectral regrowth. Users are allocated a narrow bandwidth which although it has a small fractional bandwidth does not suffer from memory effects. Therefore, memory-less DPD models may cope with static nonlinearity and can be implemented using updatable look up tables. In contrast, in satellite communications these time-varying ambient and circuit parameters do not exist or they have a negligible effect. Firstly, a regulated power supply (<1%) is used onboard. Secondly, there are no nearby objects causing reflections, so there is generally no load mismatch due to reflecting objects. Further, the temperature variation range is between −10 degrees to +80 degrees Celsius in which the PA gain varies by several dBs, a PA with on-chip temperature compensation circuit can be used to reduce this gain variation to approximately 1 dB. Finally, the aging effect should be taken into consideration. Industrial constraints consider that a reliable PA should have less than 10% of characteristics variation after ten years of operation. As a result, approximately 0.5 dB gain decrease is expected. In view of the abovementioned slow and fast time-varying PA dependent parameters onboard a satellite, non-adaptive DPD can tolerate these slow varying parameters.

The invention claimed is:

1. A signal transmission system for a satellite comprising:
   means for producing a signal to be transmitted;
   a first signal channel which includes a digital pre-distortion device for applying a first pre-distortion to the signal, and a driver amplifier;
   a second signal channel for processing an envelope of the signal, wherein the second channel is connected in parallel to the first channel, which includes: an envelope amplifier whose output is connected to the driver amplifier and which controls the power supply to the driver amplifier by applying a power gain to said envelope of the signal, a second digital pre-distortion device for applying a second pre-distortion to the envelope of the signal to cancel out the non-linearity of the envelope amplifier; and
   output means for transmitting the signal.

2. A signal transmission system according to claim 1, wherein the first channel includes a power amplifier.

3. A signal transmission system according to claim 2, wherein the power amplifier can be switched off when low power output is required.

4. A signal transmission system according to claim 1, wherein the output means further comprise an antenna.

5. A signal transmission system according to claim 4, wherein the means for modulating the output load of the system includes a matching network for modulating a load on the antenna.

6. A signal transmission system according to claim 5, wherein the matching network comprises one or more varactors.

7. A signal transmission system according to claim 4, wherein the means for modulating the output load of the system include a matching network for modulating a load on the antenna.

8. A signal transmission system according to claim 1, further comprising means for modulating the power output by the output means.

9. A signal transmission system according to claim 1, wherein the output means further comprise an antenna.

10. A method of transmitting a signal comprising:
    producing a signal to be transmitted;
    applying a first pre-distortion to the signal and amplifying the distorted signal using a driver amplifier;
    isolating a band-limited envelope of the signal and applying a second pre-distortion to the envelope to substantially cancel out the non-linearity introduced by an envelope amplifier amplifying the envelope of the signal;
    using the distorted envelope signal to control the driver amplifier;
    modulating an output load of the system; and
    transmitting the modulated output using an antenna.

11. A signal transmission system for a satellite comprising:
    means for producing a signal to be transmitted;
    a first signal channel which includes a digital pre-distortion device for applying pre-distortion to the signal;
    a second signal channel for processing an envelope of the signal, which includes a second digital pre-distortion device for applying pre-distortion to the envelope of the signal and an envelope amplifier whose output is connected to a driver amplifier; said envelope amplifier applying a power gain to said envelope of the signal; means for modulating the output load of the system; and output means including an output load for transmitting the modulated output signal.

* * * * *